(12) United States Patent
Gupta et al.

(10) Patent No.: US 9,001,593 B2
(45) Date of Patent: Apr. 7, 2015

(54) APPARATUS TO SUPPRESS CONCURRENT READ AND WRITE WORD LINE ACCESS OF THE SAME MEMORY ELEMENT IN A MEMORY ARRAY

(71) Applicant: Apple Inc., Cupertino, CA (US)

(72) Inventors: Hitesh Gupta, Santa Clara, CA (US); Greg M Hess, Mountain View, CA (US); Aravind Kandala, San Jose, CA (US)

(73) Assignee: Apple Inc., Cupertino, CA (US)

( * ) Notice: Subject to any disclaimer, the term of this patent is extended or adjusted under 35 U.S.C. 154(b) by 178 days.

(21) Appl. No.: 13/725,180

(22) Filed: Dec. 21, 2012

(65) Prior Publication Data

US 2014/0177346 A1   Jun. 26, 2014

(51) Int. Cl.
  *G11C 16/10*    (2006.01)
  *G11C 8/08*    (2006.01)

(52) U.S. Cl.
  CPC ........................................ *G11C 8/08* (2013.01)

(58) Field of Classification Search
  CPC ....................................................... G11C 16/10
  USPC ................................................... 365/189.04
  See application file for complete search history.

(56) References Cited

U.S. PATENT DOCUMENTS

| | | | |
|---|---|---|---|
| 6,161,168 A | 12/2000 | Kametani | |
| 6,314,045 B1 | 11/2001 | Ikeda | |
| 7,340,577 B1 | 3/2008 | Van Dyke et al. | |
| 8,255,759 B2 | 8/2012 | Pan et al. | |
| 2003/0151950 A1* | 8/2003 | Tamada et al. | 365/185.19 |
| 2011/0255353 A1* | 10/2011 | Fukushima et al. | 365/191 |
| 2013/0258761 A1* | 10/2013 | Sharpe-Geisler et al. | 365/154 |
| 2014/0098596 A1* | 4/2014 | Poulton et al. | 365/154 |
| 2014/0119102 A1* | 5/2014 | Shankar et al. | 365/154 |

* cited by examiner

*Primary Examiner* — Hoai V Ho
*Assistant Examiner* — Min Huang
(74) *Attorney, Agent, or Firm* — Meyertons, Hood, Kivlin, Kowert & Goetzel, P.C.; Stephen J. Curran

(57) ABSTRACT

A memory array includes a number of word lines, with each word line coupled to a word line driver for memory write operations and a word line driver for memory read operations. A decode stage includes write logic for each word line and read logic for each word line. A word line driver stage includes a write word line driver and a read word line driver. The write logic for at least one world line is configured to enable the write word line driver for a memory write operation of the word line while prohibiting the read word line logic from enabling the read word line driver for a memory read operation of the word line.

16 Claims, 4 Drawing Sheets

APPARATUS TO SUPPRESS CONCURRENT READ AND WRITE WORD LINE ACCESS OF THE SAME MEMORY ELEMENT IN A MEMORY ARRAY

BACKGROUND

1. Technical Field

This disclosure relates generally to computer memory operation and design, and more particularly to methods, apparatus, devices, and computer memory to suppress concurrent access to read and write word lines of a same memory element in a memory array.

2. Description of the Related Art

In recent years, mobile devices such as smart phones and tablet computers have become increasingly sophisticated. In addition to supporting telephone calls, many mobile devices now provide access to the internet, email, text messaging, and navigation using the global positioning system (GPS). Mobile devices that support such sophisticated functionality often include many components. Mobile devices, for example, include such components as computer memory.

Computer memory may include a number of memory elements, each of which may include a write word line and a read word line. In some computer memories, a read operation and a write operation may occur concurrently with respect to the same memory element. Reading from a memory element that is currently being written to, however, may provide incorrect results. Further, the read operation results in inefficient power consumption because the results of the read operation are typically discarded.

SUMMARY

Various example apparatus utilized with a memory array are disclosed. Such a memory array may include a number of memory elements, with each element including a write word line and a read word line. Each write word line may be coupled to a write word line driver for memory write operations and each read word line may be coupled to a read word line driver for memory read operations. Such apparatus may include: a write NAND gate of a decode stage for the memory array. The write NAND gate may be configured to receive a plurality of predecoded write address signals and to provide a write output signal to a write word line driver based on the write address signals. The write output signal may selectively enable the write word line driver to drive a write word line of a particular memory element for a memory write operation. The apparatus may also include a read NAND gate of the decode stage configured to receive a plurality of predecoded read address signals and the write output signal and to provide a read output signal to a read word line driver based on the read address signals and the write output signal. The read output signal may selectively enable the read word line driver to drive the read word line of the particular memory element for a memory read operation. The read NAND gate may enable the read word line driver only if the write output signal and the read address signals are at a logic high.

Also disclosed are methods of operating a memory array as described above. Such methods may include receiving, by a write NAND gate of a decode stage for the memory array, a number of write address signals. The write NAND gate may be configured to provide a write output signal to a write word line driver based on the write address signals and the write word line driver may be configured to selectively drive a write word line of a particular memory element for a memory write operation based on the write output signal. Such methods may also include receiving, by a read NAND gate of the decode stage, a number of read address signals and the write output signal. The read NAND gate may be configured to provide a read output signal to a read word line driver based on the read address signals and the write output signal and the read word line driver may be configured to selectively drive the read word line of the particular memory element for a memory read operation based on the read output signal. Such methods may also include enabling, by the read NAND gate via the read output signal, the read word line driver to drive the read word line of the particular memory element for a memory read operation only if the write output signal and the read address signals are at a logic high.

Figure 1:
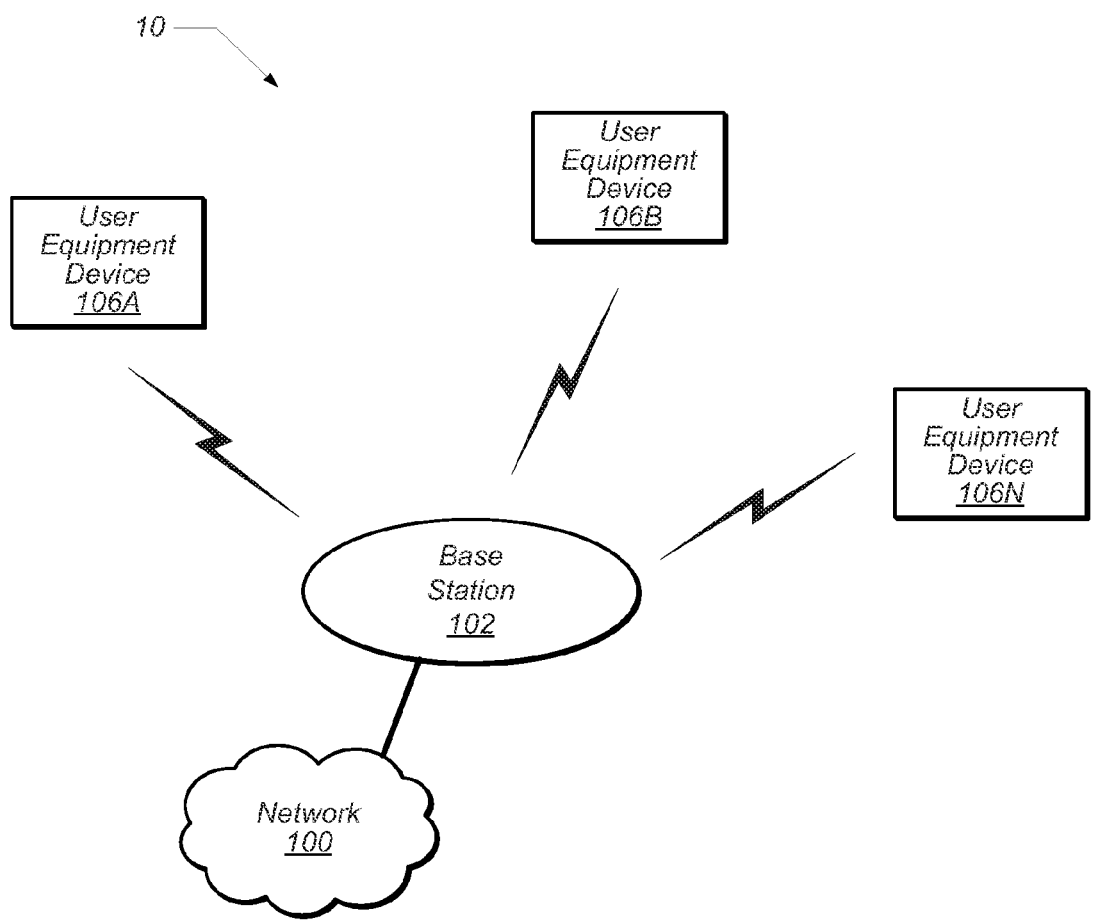
FIG. 1 sets forth a block diagram of one embodiment of a wireless communication system.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent_ claims may be combined with those of the independent claims and features from respective independent claims may be combined in any appropriate manner and not merely in the specific combinations enumerated in the appended claims.

DETAILED DESCRIPTION

FIG. 1 sets forth a block diagram of one embodiment of a wireless communication system. The system of FIG. 1 is one example of any of a variety of wireless communication systems. The wireless communication system 10 includes a base station 102 which communicates over a wireless transmission medium such as, for example, an over the air interface with one or more user equipment (UE) devices, 106A through 106N. The base station 102 is also coupled a network 100 via another interface, which may be wired or wireless. Components identified by reference designators that include both a number and a letter may be referred to by the only a number where appropriate.

The base station 102 may be a base transceiver station (BTS) or cell site, and may include hardware that enables wireless communication with one or more of the UEs 106. The base station 102 may also be equipped to communicate with the network 100. Thus, the base station 102 may facilitate communication between the UEs 106 and/or between the UEs 106 and the network 100. The communication area (or coverage area) of the base station 102 may be referred to as a "cell." In various embodiments, the base station 102 and the UEs may be configured to communicate over the transmission medium using any of various wireless communication radio access technologies such as LTE, eHRPD, GSM, CDMA, WLL, WAN, WiFi, WiMAX, etc. In embodiments that communicate using the eHRPD standard, the BTS 102 may be referred to as an HRPD BTS, and the network 100 may include an eAN/ePCF and a number of gateways including HRPD gateway (HSGW), a PDN gateway (P-GW), and a number of policy and packet control functions that may be associated with a service provider, for example.

In one embodiment, each of the UEs 106A-106N may be representative of a device with wireless network connectivity such as a mobile phone, a hand-held device, a computer or a tablet, or virtually any type of wireless device. As described further below, the UE 106 may include at least one processor that is configured to execute program instructions stored in a memory. Accordingly, in some embodiments, the UE 106 may perform one or more portions of the functionality described below by executing such stored instructions. However, in other embodiments, the UE 106 may include one or more hardware elements and/or one or more programmable hardware elements such as an FPGA (field-programmable gate array) that may be configured to perform the one or more portions the functionality described below. In still other embodiments, any combination of hardware and software may be implemented to perform the functionality described below.

In the system 10 of FIG. 1, any of the UEs 106 may include, among other components, a memory array, where the memory array includes a number of memory elements. Each of the memory elements may include a write word line and a read word line. Each write word line may be coupled to a write word line driver for memory write operations and each read word line may be coupled to a read word line driver for memory read operations.

The UE 106 may also include an apparatus that includes a decode stage and a word line driver stage, where the decode stage includes write logic for each word line and read logic for each word line. The word line driver stage may include a write word line driver and a read word line driver. In such an example apparatus, the write logic for a particular memory element may be configured to enable the write word line driver for a memory write operation of the particular memory element while prohibiting the read word line logic from enabling the read word line driver for a memory read operation of the particular memory element. That is, when a write operation for a particular memory element is to be carried out, the write logic may be configured to prohibit any read operation for the same particular memory element.

Figure 2:
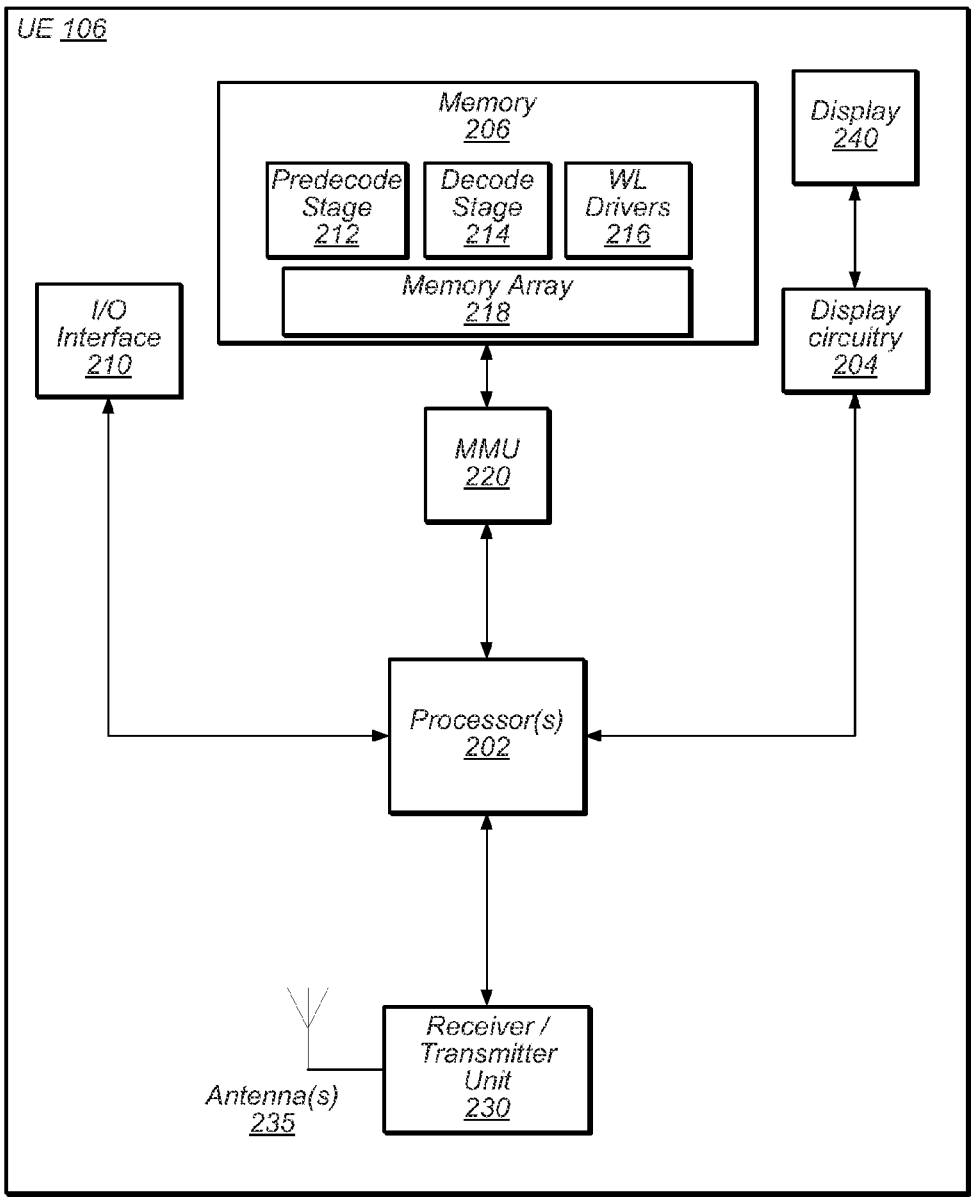
FIG. 2 sets forth a block diagram of one embodiment of a wireless communication device shown in FIG. 1.

For further explanation, FIG. 2 sets forth a block diagram of one embodiment of a wireless communication device shown in FIG. 1. The UE 106 includes one or more processors 202 (or one or more processor cores 202) which are coupled to display circuitry 204 which is in turn coupled to the display 240. The display circuitry 204 may be configured to perform graphics processing and provide display signals to the display 240.

The one or more processors 202 are also coupled to a memory management unit (MMU) 220 and to a receiver/transmitter (R/T) unit 230. The MMU 220 is coupled to a memory 206. The UE 106 also includes an I/O interface 210 that is coupled to the processor(s) 202, and may be used for coupling the UE 106 to a computer system, or other external device. It is noted that in one embodiment the components shown within UE 106 of FIG. 2 may be manufactured as standalone components. In other embodiments, however, various ones of the components may be part of one or more chipsets or part of a system on chip (SOC) implementation.

In various embodiments, the processors 202 may be representative of a number of different types of processors that may be found in a wireless communication device. For example, the processors 202 may include general processing capability, digital signal processing capability, as well as hardware accelerator functionality, as desired. The processors 202 may include baseband processing and therefore may digitally process the signals received by the R/T unit 230. The processors 202 may also process data that may be transmitted by the R/T unit 230. The processors 202 may also perform a number of other data processing functions such as running an operating system and user applications for the UE 106.

In one embodiment, the MMU 220 may be configured to receive addresses from the one or more processors 202 and to translate those addresses to locations in memory (e.g., memory 206) and/or to other circuits or devices, such as the display circuitry 204, R/T unit 230, and/or display 240. The MMU 220 may also return data to one or more of the processors 202 from the locations in memory 206. The MMU 220 may be configured to perform memory protection and page table translation or set up. In some embodiments, the MMU 220 may be included as a portion of one or more of the processors 202.

The R/T unit 230 may, in one embodiment, include analog radio frequency (RF) circuitry for receiving and transmitting RF signals via the antenna 235 to perform the wireless communication. The R/T unit 230 may also include down-conversion circuitry to lower the incoming RF signals to the baseband or intermediate frequency (IF) as desired. For example, the R/T unit 230 may include various RF and IF filters, local oscillators, mixers, and the like. Since the UE 106 may operate according to a number of radio access technologies, the R/T unit 230 may include a corresponding number of RF front end portions to receive and down-convert, as well as up-convert and transmit the respective RF signals of each technology.

In some embodiments, the memory 206 may be configured with a memory array 218 that includes a number of memory elements, with each element including a write word line and a read word line. Each write word line may be coupled to a write word line driver 216 for memory write operations and each read word line may be coupled to a read word line driver 216 for memory read operations. The write and read word line drivers may be selectively enabled by logic of a decode stage 214 based on predecoded address signals received from a predecode stage 212. In some embodiments, each word line driver may be implemented as an inverter.

The decode stage 214 may include, for each memory element, a write NAND gate. The write NAND gate may be configured to receive a predecoded write address signals and to provide a write output signal to a write word line driver based on the write address signals. The write output signal may selectively enable the write word line driver to drive a write word line of a particular memory element for a memory write operation.

The decode stage 214 may also include a read NAND gate of the decode stage that is configured to receive a plurality of predecoded read address signals as well as the write output signal. Based on the predecoded read address signals and the write output signal, the read NAND gate may provide a read output signal to a read word line driver. The read output signal may selectively enable the read word line driver to drive a read word line of the particular memory element for a memory read operation. Rather than driving accessing both the write and read word line of the same particular memory element simultaneously, the read NAND gate is further configured to enable the read word line driver only if the write output signal and the read address signals are at a logic high. That is, the write output signal effectively bypasses the read NAND gate when a write operation is to be carried out. In this way, the write and read word lines of the same memory element are not driven for concurrently.

Figure 3A:
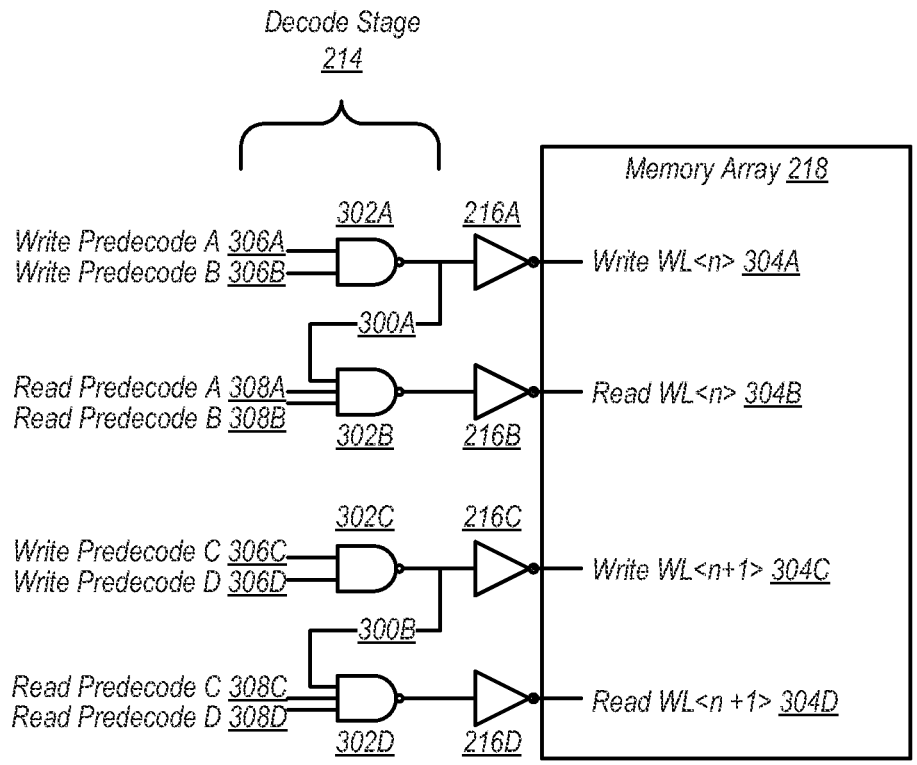
FIG. 3A sets forth a block diagram of example decode logic for a memory array.

For further explanation, FIG. 3A sets forth a block diagram of example decode logic for a memory array. The example decode stage 214 includes decode logic configured to enable a write and read operation of a first memory element "n" and as well as decode logic configured to enable a write and read operation of a second memory element "n+1". Each word line driver 216 is implemented in this example as an inverter. It is also noted, that although only two memory elements and associated decode logic and drivers are depicted here for purposes of clarity, a memory array may be configured with any number of memory elements, word lines, word line drivers, and associated logic.

The decode logic for each memory element includes a write NAND gate 302A, 302C and a read NAND gate 302B, 302D. The write NAND gate 302A, 302C is configured to receive a plurality of predecoded write address signals 306A, 306B, 308C, 308D. Based on the predecoded write address signals 306A, 306B, 308C, 308D, the write NAND gate 302A, 302C provides a write output signal 300A to a write word line driver 216A, 216C. The write output signal selectively enables the write word line driver 216A, 216C to drive a write word line 304A, 304C of an associated memory element for a memory write operation.

The read NAND gate 302B, 302D of the example decode stage 214 of FIG. 3 is configured to receive a plurality of predecoded read address signals 308A, 308B, 308C, 308D as well as the write output signal 300A, 300B. The write output signal 300A, 300B, when received by the read NAND gate 302B, 302D, may also be referred to as an 'interlock signal.' The read NAND gate 302B, 302D is configured to provide a read output signal to a read word line driver 216B, 216D based on the read address signals 308A, 308B, 308C, 308D and the interlock signal 300A, 300B.

When the write NAND gate receives two logic high predecode signals (indicating a write to a memory element), the write output signal is at logic low. In such an example, the read NAND gate receives the interlock signal as a logic low and the output of the read NAND gate 302B, 302D is at logic high regardless of the read address inputs 308A, 308B, 308C, 308D. At logic high, the read output signal of the read NAND gate does not enable the read word line driver. In this way, any write operation for a memory element prohibits, at least to some degree, a read operation of the same memory from occurring concurrently.

Because the address signals for both read and write are typically based on the same clock, the signals may be received by the decode logic at approximately the same time when a memory read and write operation is to be carried out concurrently. In such an embodiment, the output of the write NAND gate may arrive at the input of the read NAND gate slightly after the read NAND gate begins to enable the read word line driver. Although the read operation would be greatly suppressed, a 'glitch' of sorts may occur for the time between the output of the read NAND gate transitioning to logic low and the read NAND gate receiving the interlock signal causing the output of the read NAND gate to transition back to a logic high. Example decode logic configured as described in FIG. 3A, then, may be configured to provide a logic low write output signal 300A more quickly so as to reduce a possible 'glitch' at the outset of a concurrent read and write operation. Further, in some embodiments, the write output signal 300A may be configured to remain at a logic low for some time after the read operation would have otherwise completed so as to reduce any possible glitch at the end of a concurrent read and write operation. In some embodiments, for example, the write NAND gate may be configured to provide an output more quickly by lowering the beta value (described below in greater detail). While more quickly providing the output (the interlock signal) may provide some benefit in reducing the 'glitch', the read NAND gate still imposes some delay as an additional piece of logic in the path.

Figure 3B:
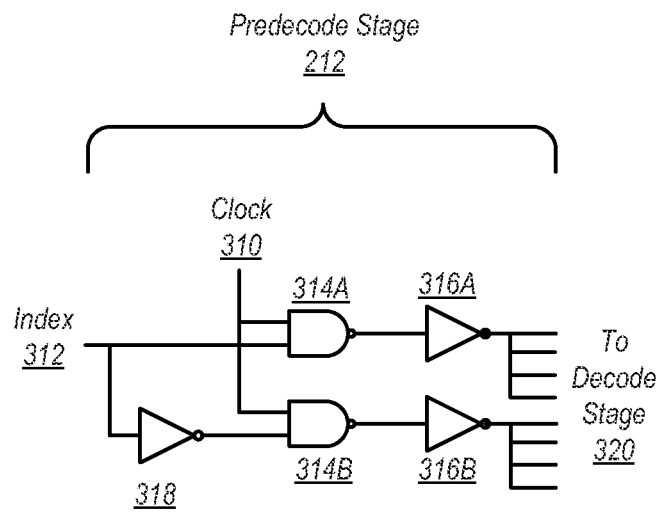
FIG. 3B sets forth a block diagram of example predecode logic for a memory array.

For further explanation, therefore, FIG. 3B sets forth a block diagram of example predecode logic for a memory array. The example predecode stage 212 of FIG. 3B depicts one example set of logic for either providing write address signals or read address signals. The decode logic for each word line in the example of FIG. 3A may receive write address signals from one instance of the logic in the example of FIG. 3B and read address signals from another instance of the logic in the example of FIG. 3B.

The predecode logic in the example of FIG. 3B may be configured to provide write address signals to a write NAND gate faster than corresponding predecode logic provides read address signals to a read NAND gate. The term 'corresponding' here refers to write logic and read logic for a same memory element.

The predecode logic here includes a first NAND gate 314A, and a NAND gate 314B. The first NAND gate 314A receives a clock signal 310 and an address index bit 312. The second NAND gate 314B also receives the clock signal as well as an inverted 318 index bit 312. Each NAND gate 314 provides an output signal to an inverter 316A, 316B which drives signals (referred to here as 'predecoded address signals') to the decode stage 320. When the example logic of FIG. 3B is implemented as write predecode logic (meaning the logic provides predecoded address signals to a write NAND gate), the predecode logic may be configured such that the beta value of the NAND 314A, 314B is less than that of a corresponding predecode read logic. The term 'beta value' refers to the ratio of pMOS width to nMOS width of the logic. Reducing such a beta value increases the rate at which a signal falls at an output of the NAND gate.

While reducing the beta value may provide for a faster predecode of write address signals, the reduction may also cause some change to other electrical and operational characteristics. To offset this change, the beta value of the inverter 316A, 316B may also be increased. Further, the increased beta value causes a delay in the rising edge of the address signals. As such, the write address signals will be provided to the write NAND gate of the decode stage for a short amount of time longer than the corresponding read address signals are provided to the read NAND gate of the decode stage.

Reducing the beta value of the predecode NAND gates 314A, 314B of predecode write logic (relative to predecode read logic) may enable write address signals to arrive at the input of the write NAND gate more quickly than read address signals arrive at the input of the read NAND gate (when a write and read operation are to be performed concurrently on a same memory element). Further, increasing the beta value of the inverter 316A, 316B of predecode write logic relative to corresponding predecode read logic may enable the write address signals to remain at the inputs of the write NAND gate after read address signals have been removed from the inputs of a corresponding read NAND gate. In this way, the write NAND gate will begin prohibiting the read NAND gate to enable the read word line driver prior to the read NAND gate receiving address signals and until the read NAND gate no longer receives the address signals.

Figure 4:
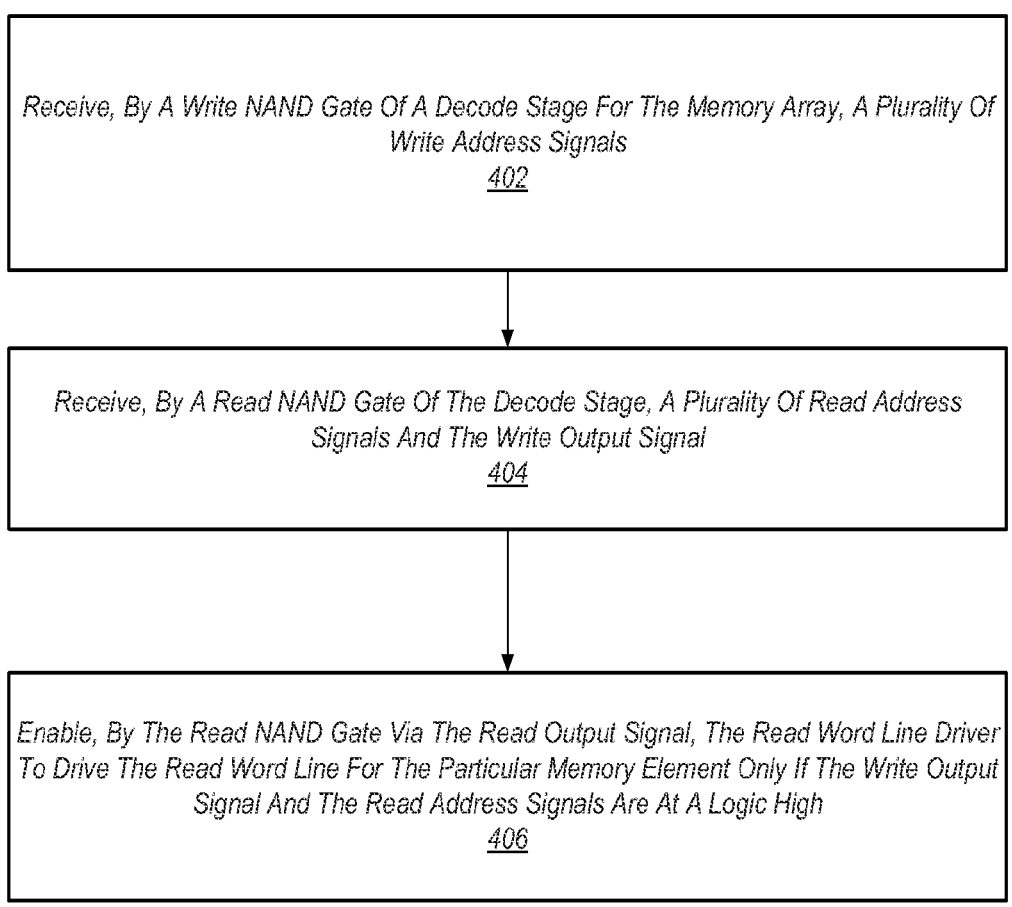
FIG. 4 sets forth a flowchart illustrating an example method for use with a memory array.

For further explanation, FIG. 4 sets forth a flowchart illustrating an example method for suppressing concurrent read and write operations of a same memory element in a memory array. Such a memory array may include a plurality of memory elements, with each element including a write word line and a read word. In such an embodiment, each write word line may be coupled to a write word line driver for memory write operations and each read word line may be coupled to a read word line driver for memory read operations.

The method of FIG. 4 includes receiving 402, by a write NAND gate of a decode stage for the memory array, a plurality of write address signals. In the method of FIG. 4, the write NAND gate is configured to provide a write output signal to a write word line driver based on the write address signals and the write word line driver is configured to selectively drive a write word line of a particular memory element for a memory write operation based on the write output signal. Receiving 402, by a write NAND gate of a decode stage for the memory array, a plurality of write address signals may be carried out by receiving predecoded address signals from predecode logic, such as the predecode stage 212 in the example of FIG. 3B.

The method of FIG. 4 also includes receiving 404, by a read NAND gate of the decode stage, a plurality of read address signals and the write output signal. In the method of FIG. 4, the read NAND gate is configured to provide a read output signal to a read word line driver based on the read address signals and the write output signal. The read word line driver is also configured to selectively drive a read word line of the same, particular memory element for a memory read operation based on the read output signal.

The method of FIG. 4 also includes enabling 406, by the read NAND gate via the read output signal, the read word line driver to drive the read word line of the particular memory element for a memory read operation only if the write output signal and the read address signals are at a logic high.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus for use in a memory array, the memory array comprising a plurality of memory elements, with each memory element comprising a read word line and a write word line, wherein each write word line is coupled to a write word line driver and each read word line is coupled to a read word line driver, the apparatus comprising:
   a predecode stage including:
      a predecode read logic configured to decode one or more read address signals and generate a plurality of predecoded read address signals; and
      a predecode write logic configured to decode one or more write address signals and generate a plurality of predecoded write address signals, wherein the the predecoded write address signals are generated faster than the predecoded read address signals;
   a write NAND gate of a decode stage for the memory array, wherein the write NAND gate is configured to receive the plurality of predecoded write address signals and to provide a write output signal to a write word line driver based on the write address signals, the write output signal selectively enabling the write word line driver to drive the write word line of a particular memory element for a memory write operation; and
   a read NAND gate of the decode stage configured to receive the plurality of predecoded read address signals and the write output signal and to provide a read output signal to a read word line driver based on the read address signals and the write output signal, wherein the read output signal selectively enables the read word line driver to drive a read word line of the particular memory element for a memory read operation, wherein the read NAND gate is further configured to enable the read word line driver only if the write output signal and the read address signals are at a logic high.

2. The apparatus of claim 1, wherein:
the predecode write logic includes an AND structure;
the predecode read logic includes an AND structure; and
the AND structure of the predecode write logic has a beta value less than that of the AND structure of the predecode read logic.

3. The apparatus of claim 2, wherein:
the predecode write logic also includes an inverter coupled to the output of the AND structure of the predecode write logic;
the predecode read logic also includes an inverter coupled to the output of the AND structure of the predecode read logic; and
the inverter of the predecode write logic has a beta value greater than that of the predecode read logic.

4. The apparatus of claim 1, wherein the write NAND gate is configured to provide the write output signal faster than the read NAND gate is configured to provide the read output signal.

5. A device comprising:
a memory array that includes a plurality of memory elements, wherein each memory element includes a read word line and a write word line, wherein each write word line is coupled to a write word line driver and each read word line is coupled to a read word line driver;
predecode logic configured to decode one or more write address signals and generate a plurality of predecoded write address signals, decode one or more read address signals, and generate a plurality of predecoded read address signals, wherein the predecode logic is further configured to generate the predecoded write address signals faster than the predecoded read address signals; and decode logic comprising:
a write NAND gate of a decode stage for the memory array, wherein the write NAND gate is configured to receive the plurality of predecoded write address signals and to provide a write output signal to a write word line driver based on the write address signals, the write output signal selectively enabling the write word line driver to drive a write word line of a particular memory element for a memory write operation; and
a read NAND gate of the decode stage configured to receive the plurality of predecoded read address signals and the write output signal and to provide a read output signal to a read word line driver based on the read address signals and the write output signal, wherein the read output signal selectively enables the read word line driver to drive the read word line of the particular memory element for a memory read operation, wherein the read NAND gate is further configured to enable the read word line driver only if the write output signal and the read address signals are at a logic high.

6. The device of claim 5, wherein the device further comprises a wireless mobile device.

7. The device of claim 5, wherein the predecode logic includes predecode write logic and predecode read logic, wherein:
the predecode write logic includes an AND structure;
the predecode read logic includes an AND structure; and
the AND structure of the predecode write logic has a beta value less than that of the AND structure of the predecode read logic.

8. The device of claim 7, wherein:
the predecode write logic also includes an inverter coupled to the output of the AND structure of the predecode write logic;
the predecode read logic also includes an inverter coupled to the output of the AND structure of the predecode read logic; and
the inverter of the predecode write logic has a beta value greater than that of the predecode read logic.

9. The device of claim 5, wherein the write NAND gate is configured to provide the write output signal faster than the read NAND gate is configured to provide the read output signal.

10. A computer memory comprising:
a plurality of memory elements, wherein each memory element includes a write word line and read word line, wherein each write word line is coupled to a write word line driver and each read word line is coupled to a read word line driver;
predecode logic configured to decode one or more write address signals and generate a plurality of predecoded write address signals, and decode one or more read address signals and generate a plurality of predecoded read address signals, wherein the predecode logic is further configured to generate the predecoded write address signals faster than the predecoded read address signals; and
decode logic comprising:
a write NAND gate of a decode stage for the memory array, wherein the write NAND gate is configured to receive the plurality of predecoded write address signals and provide a write output signal to a write word line driver based on the write address signals, the write output signal selectively enabling the write word line driver to drive a write word line of a particular memory element for a memory write operation; and
a read NAND gate of the decode stage configured to receive the plurality of predecoded read address signals and the write output signal and to provide a read output signal to a read word line driver based on the read address signals and the write output signal, wherein the read output signal selectively enables the read word line driver to drive a read word line of the particular memory element for a memory read operation, wherein the read NAND gate is further configured to enable the read word line driver only if the write output signal and the read address signals are at a logic high.

11. The computer memory of claim 10, wherein the predecode logic includes predecode write logic and predecode read logic, wherein:
the predecode write logic includes an AND structure;
the predecode read logic includes an AND structure; and
the AND structure of the predecode write logic has a beta value less than that of the AND structure of the predecode read logic.

12. The computer memory of claim 11, wherein:
the predecode write logic also includes an inverter coupled to the output of the AND structure of the predecode write logic;
the predecode read logic also includes an inverter coupled to the output of the AND structure of the predecode read logic; and
the inverter of the predecode write logic has a beta value greater than that of the predecode read logic.

13. The computer memory of claim 10, wherein the write NAND gate is configured to provide the write output signal faster than the read NAND gate is configured to provide the read output signal.

14. A method of operating a memory array, the memory array comprising a plurality of memory elements, wherein each memory element includes a write word line and a read word line, wherein each write word line is coupled to a write word line driver and each read word line is coupled to a read word line driver, wherein the method comprises:
predecoding one or more write address signals and generating a plurality of predecoded write address signal;
predecoding one or more read address signals and generating a plurality of predecoded read address signals;
wherein the predecoded write address signals are generated faster than the predecoded read address signals;
receiving, by a write NAND gate of a decode stage for the memory array, the plurality of predecoded write address signals, wherein the write NAND gate is configured to provide a write output signal to a write word line driver based on the write address signals and the write word line driver is configured to selectively drive a write word line of a particular memory element for a memory write operation based on the write output signal;
receiving, by a read NAND gate of the decode stage, the plurality of predecoded read address signals and the write output signal, wherein the read NAND gate is configured to provide a read output signal to a read word line driver based on the read address signals and the write output signal and the read word line driver is configured to selectively drive a read word line of the particular memory element for a memory read operation based on the read output signal; and
enabling, by the read NAND gate via the read output signal, the read word line driver to drive the read word line of the particular memory element for a memory read operation only if the write output signal and the read address signals are at a logic high.

15. An apparatus for use in a memory array, the memory array comprising a plurality of memory elements, wherein each memory element includes a write word line and a read word line, wherein each write word line is coupled to a write word line driver and each read word line is coupled to a read word line driver, the apparatus comprising:
- a decode stage that includes write logic for each memory element and read logic for each memory element; and
- a word line driver stage that includes a write word line driver and a read word line driver for each memory element;
- wherein, the write logic for a particular memory element is configured to enable the write word line driver to drive the write word line of the particular memory element for a memory write operation while prohibiting the read word line logic from enabling the read word line driver to drive the read word line of the particular memory element for a memory read operation;
- wherein the write logic is configured to enable the write word line driver to drive the write word line for the particular memory element for a memory write operation of the word line upon receiving predecoded write address signals from a predecode stage;
- wherein the read logic is configured to enable the read word line driver to enable the read word line of the particular memory element for a memory read operation of the word line upon receiving predecoded read address signals from the predecode stage unless prohibited by the write logic; and
- wherein upon a concurrent read from and write to the particular memory element, the write logic is configured to receive the predecoded address signals prior to the read logic receiving the predecoded address signals.

16. The apparatus of claim 15, wherein:
the write logic is further configured to continue receiving the predecoded address signals until after the read logic ceases to receive the predecoded address signals.

* * * * *